(12) United States Patent
Zhang et al.

(10) Patent No.: US 10,886,396 B2
(45) Date of Patent: Jan. 5, 2021

(54) TRANSISTOR STRUCTURES HAVING A DEEP RECESSED P+ JUNCTION AND METHODS FOR MAKING SAME

(71) Applicant: Cree, Inc., Durham, NC (US)

(72) Inventors: Qingchun Zhang, Cary, NC (US); Brett Hull, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/148,214

(22) Filed: Oct. 1, 2018

(65) Prior Publication Data
US 2019/0043980 A1 Feb. 7, 2019

Related U.S. Application Data

(63) Continuation of application No. 13/730,068, filed on Dec. 28, 2012, now Pat. No. 10,115,815.

(51) Int. Cl.
*H01L 29/78* (2006.01)
*H01L 29/16* (2006.01)
(Continued)

(52) U.S. Cl.
CPC ...... *H01L 29/7802* (2013.01); *H01L 29/0619* (2013.01); *H01L 29/1095* (2013.01);
(Continued)

(58) Field of Classification Search
None
See application file for complete search history.

(56) References Cited

U.S. PATENT DOCUMENTS 4,803,533 A * 2/1989 Chang ................. H01L 21/2253
257/345
5,136,349 A 8/1992 Yilmaz et al.
(Continued)

FOREIGN PATENT DOCUMENTS

CN 102832248 A 12/2012
EP 1143526 A2 10/2001
(Continued)

OTHER PUBLICATIONS

First Office Action and Search Report for Chinese Patent Application No. 201380068265.9, dated Mar. 13, 2017, 24 pages.
(Continued)

*Primary Examiner* — Sitaramarao S Yechuri
(74) *Attorney, Agent, or Firm* — Withrow & Terranova, P.L.L.C.

(57) ABSTRACT

A transistor device having a deep recessed P+ junction is disclosed. The transistor device may comprise a gate and a source on an upper surface of the transistor device, and may include at least one doped well region, wherein the at least one doped well region has a first conductivity type that is different from a conductivity type of a source region within the transistor device and the at least one doped well region is recessed from the upper surface of the transistor device by a depth. The deep recessed P+ junction may be a deep recessed P+ implanted junction within a source contact area. The deep recessed P+ junction may be deeper than a termination structure in the transistor device. The transistor device may be a Silicon Carbide (SiC) MOSFET device.

29 Claims, 11 Drawing Sheets

(51) Int. Cl.
*H01L 29/66* (2006.01)
*H01L 29/06* (2006.01)
*H01L 29/10* (2006.01)
*H01L 29/417* (2006.01)
*H01L 29/08* (2006.01)

(52) U.S. Cl.
CPC .... *H01L 29/1608* (2013.01); *H01L 29/41766* (2013.01); *H01L 29/66477* (2013.01); *H01L 29/66727* (2013.01); *H01L 29/7811* (2013.01); *H01L 29/7828* (2013.01); *H01L 29/0878* (2013.01); *H01L 29/66068* (2013.01); *H01L 29/66712* (2013.01)

(56) References Cited

U.S. PATENT DOCUMENTS

| | | | |
|---|---|---|---|
| 5,661,314 A | 8/1997 | Merrill et al. | |
| 5,665,987 A * | 9/1997 | Muraoka | H01L 29/7392 257/133 |
| 5,783,474 A | 7/1998 | Ajit | |
| 5,844,259 A | 12/1998 | Kinzer et al. | |
| 5,915,179 A | 6/1999 | Etou et al. | |
| 6,031,265 A * | 2/2000 | Hshieh | H01L 29/1095 257/334 |
| 6,084,268 A | 7/2000 | de Fresart et al. | |
| 6,169,300 B1 | 1/2001 | Fragapane | |
| 6,184,555 B1 | 2/2001 | Tihanyi et al. | |
| 6,198,129 B1 | 3/2001 | Murakami | |
| 6,573,534 B1 * | 6/2003 | Kumar | H01L 29/1608 257/77 |
| 6,847,091 B2 | 1/2005 | DeBoy et al. | |
| 6,977,414 B2 | 12/2005 | Nakamura et al. | |
| 7,795,691 B2 | 9/2010 | Zhang et al. | |
| 7,989,882 B2 | 8/2011 | Zhang et al. | |
| 8,211,770 B2 | 7/2012 | Zhang et al. | |
| 8,232,558 B2 | 7/2012 | Zhang et al. | |
| 8,471,267 B2 | 6/2013 | Hayashi et al. | |
| 8,987,817 B2 | 3/2015 | Tarui | |
| 9,472,405 B2 | 10/2016 | Nakano | |
| 2001/0020732 A1 | 9/2001 | Deboy et al. | |
| 2003/0073270 A1 | 4/2003 | Hisada et al. | |
| 2003/0235942 A1 | 12/2003 | Nakamura et al. | |
| 2004/0119076 A1 * | 6/2004 | Ryu | H01L 21/8213 257/77 |
| 2006/0102908 A1 | 5/2006 | Imai et al. | |
| 2006/0226494 A1 | 10/2006 | Hshieh | |
| 2006/0267091 A1 * | 11/2006 | Takahashi | H01L 29/0619 257/341 |
| 2007/0278571 A1 | 12/2007 | Bhalla et al. | |
| 2008/0042172 A1 * | 2/2008 | Hirler | H01L 29/0623 257/288 |
| 2008/0157117 A1 | 7/2008 | McNutt et al. | |
| 2008/0296771 A1 * | 12/2008 | Das | H01L 23/4827 257/758 |
| 2010/0100931 A1 | 4/2010 | Novack et al. | |
| 2010/0140628 A1 | 6/2010 | Zhang | |
| 2010/0200931 A1 * | 8/2010 | Matocha | H01L 21/0465 257/401 |
| 2010/0295060 A1 | 11/2010 | Kudou et al. | |
| 2010/0301335 A1 | 12/2010 | Ryu et al. | |
| 2011/0006407 A1 * | 1/2011 | Hirler | H01L 29/0653 257/652 |
| 2011/0049564 A1 * | 3/2011 | Guan | H01L 29/66325 257/147 |
| 2011/0057202 A1 | 3/2011 | Kono et al. | |
| 2011/0101375 A1 | 5/2011 | Zhang | |
| 2011/0306175 A1 * | 12/2011 | Hebert | H01L 29/0696 438/382 |
| 2012/0049902 A1 | 3/2012 | Corona et al. | |
| 2012/0292742 A1 | 11/2012 | Itoh et al. | |
| 2013/0092978 A1 | 4/2013 | Sugawara et al. | |
| 2014/0183552 A1 | 7/2014 | Zhang et al. | |
| 2014/0183553 A1 | 7/2014 | Zhang et al. | |
| 2014/0284621 A1 | 9/2014 | Shimizu et al. | |
| 2015/0014742 A1 | 1/2015 | Lu | |
| 2015/0263145 A1 | 9/2015 | Pala et al. | |
| 2015/0311325 A1 | 10/2015 | Zhang | |
| 2017/0053987 A1 | 2/2017 | Zhang et al. | |

FOREIGN PATENT DOCUMENTS

| | | |
|---|---|---|
| EP | 1429392 A2 | 6/2004 |
| EP | 1737042 A1 | 12/2006 |
| EP | 1965432 A1 | 9/2008 |
| EP | 2068363 A2 | 6/2009 |
| EP | 2581939 A2 | 4/2013 |
| GB | 2033658 A | 5/1980 |
| GB | 2243952 A | 11/1991 |
| JP | S60196975 A | 10/1985 |
| JP | H04239778 A | 8/1992 |
| JP | H0778978 A | 3/1995 |
| JP | H10308510 A | 11/1998 |
| JP | H11330091 A | 11/1999 |
| JP | 2004193578 A | 7/2004 |
| JP | 2005191241 A | 7/2005 |
| JP | 2011258635 A | 12/2011 |
| JP | 2012235002 A | 11/2012 |
| JP | 2013149837 A | 8/2013 |
| JP | 2014022708 A | 2/2014 |

OTHER PUBLICATIONS

Second Office Action for Chinese Patent Application No. 201380068265.9, dated Nov. 29, 2017, 14 pages.
Third Office Action for Chinese Patent Application No. 201380068265.9, dated Aug. 10, 2018, 24 pages.
Examination Report for European Patent Application No. 13811320.4, dated Feb. 2, 2018, 4 pages.
Notice of Reasons for Rejection for Japanese Patent Application No. 2015-550412, dated Nov. 21, 2017, 9 pages.
Notice of Reasons for Rejection for Japanese Patent Application No. 2015-550412, dated May 15, 2018, 13 pages.
Notice of Allowance for Korean Patent Application No. 10-2015-7020113, dated Feb. 4, 2017, 4 pages.
Notification of Reasons for Refusal for Japanese Patent Application No. 2016-557300, dated Sep. 11, 2018, 9 pages.
Non-Final Office Action for U.S. Appl. No. 14/212,991, dated Dec. 28, 2018, 24 pages.
Summons to Attend Oral Proceedings for European Patent Application No. 13806028.0, mailed Oct. 30, 2018, 6, pages.
Proposed Claim Amendments for Examiner Initiated Telephone Message for Chinese Patent Application No. 201380068265.9, mailed Oct. 30, 2018, 5 pages.
Tamaki, Tomohiro, et al., "Optimization of On-State and Switching Performances for 15-20-kV 4H-SiC IGBTs," IEEE Transactions on Electron Devices, vol. 55, Issue 8, Aug. 2008, IEEE, pp. 1920-1927.
Non-Final Office Action for U.S. Appl. No. 13/730,068, dated Feb. 6, 2015, 20 pages.
Final Office Action for U.S. Appl. No. 13/730,068, dated Jul. 22, 2015, 13 pages.
Advisory Action for U.S. Appl. No. 13/730,068, dated Oct. 7, 2015, 4 pages.
Examiner's Answer for U.S. Appl. No. 13/730,068, dated May 26, 2016, 8 pages.
Non-Final Office Action for U.S. Appl. No. 13/730,133, dated Nov. 7, 2014, 18 pages.
Final Office Action for U.S. Appl. No. 13/730,133, dated May 8, 2015, 19 pages.
Advisory Action for U.S. Appl. No. 13/730,133, dated Jul. 15, 2015, 3 pages.
Non-Final Office Action for U.S. Appl. No. 13/730,133, dated Aug. 12, 2015, 17 pages.
Final Office Action for U.S. Appl. No. 13/730,133, dated Feb. 17, 2016, 17 pages.
Advisory Action, Applicant-Initiated Interview Summary, and AFCP 2.0 Decision for U.S. Appl. No. 13/730,133, dated May 5, 2016, 9 pages.

(56) References Cited

OTHER PUBLICATIONS

Notice of Allowance for U.S. Appl. No. 13/730,133, dated Aug. 8, 2016, 7 pages.
Non-Final Office Action for U.S. Appl. No. 14/212,991, dated Oct. 8, 2015, 22 pages.
Non-Final Office Action for U.S. Appl. No. 14/212,991, dated May 6, 2016, 16 pages.
Final Office Action for U.S. Appl. No. 14/212,991, dated Nov. 23, 2016, 21 pages.
Non-Final Office Action for U.S. Appl. No. 14/259,821, dated Mar. 24, 2015, 6 pages.
Final Office Action for U.S. Appl. No. 14/259,821, dated Aug. 24, 2015, 7 pages.
Advisory Action for U.S. Appl. No. 14/259,821, dated Nov. 6, 2015, 3 pages.
Non-Final Office Action for U.S. Appl. No. 14/259,821, dated Jan. 7, 2016, 7 pages.
International Search Report and Written Opinion for International Application PCT/US2013/073092 dated Feb. 17, 2014, 14 pages.
International Preliminary Report on Patentability for PCT/US2013/073092, dated Jul. 9, 2015, 9 pages.
Notice of Preliminary Rejection for Korean Patent Application No. 10-2015-7020113, dated Jun. 27, 2016, 22 pages.
International Search Report and Written Opinion for International Application PCT/US2013/073093 dated Apr. 1, 2014, 15 pages.
International Preliminary Report on Patentability for PCT/US2013/073093, dated Jul. 9, 2015, 11 pages.
International Search Report and Written Opinion for International Application PCT/US2015/011015, dated Sep. 30, 2015, 15 pages.
International Preliminary Report on Patentability for International Patent Application No. PCT/US2015/011015, dated Sep. 22, 2016, 11 pages.
"Definition of a Random Number," Oxford English Dictionary, Available online at: <<https://en.oxforddictionaries.com/definition/random_number>, Accessed May 25, 2018.
Decision on Appeal for U.S. Appl. No. 13/730,068, dated Sep. 11, 2017, 11 pages.
Non-Final Office Action for U.S. Appl. No. 13/730,068, dated Dec. 28, 2017, 17 pages.
Notice of Allowance for U.S. Appl. No. 13/730,068, dated Jun. 20, 2018, 8 pages.
Non-Final Office Action for U.S. Appl. No. 15/344,735, dated Mar. 22, 2017, 17 pages.
Final Office Action for U.S. Appl. No. 15/344,735, dated Aug. 22, 2017, 21 pages.
Advisory Action for U.S. Appl. No. 15/344,735, dated Oct. 27, 2017, 6 pages.
Non-Final Office Action for U.S. Appl. No. 15/344,735, dated Feb. 8, 2018, 24 pages.
Final Office Action for U.S. Appl. No. 15/344,735, dated May 31, 2018, 25 pages.
Advisory Action for U.S. Appl. No. 15/344,735, dated Aug. 9, 2018, 7 pages.
Advisory Action for U.S. Appl. No. 14/212,991, dated Feb. 6, 2017, 3 pages.
Non-Final Office Action for U.S. Appl. No. 14/212,991, dated Apr. 6, 2017, 19 pages.
Final Office Action for U.S. Appl. No. 14/212,991, dated Nov. 2, 2017, 20 pages.
Advisory Action for U.S. Appl. No. 14/212,991, dated Feb. 20, 2018, 6 pages.
Final Office Action for U.S. Appl. No. 14/259,821, dated Jan. 26, 2017, 11 pages.
Advisory Action for U.S. Appl. No. 14/259,821, dated Apr. 21, 2017, 3 pages.
Non-Final Office Action for U.S. Appl. No. 14/259,821, dated Aug. 28, 2017, 11 pages.
Final Office Action for U.S. Appl. No. 14/259,821, dated Mar. 28, 2018, 12 pages.
Advisory Action for U.S. Appl. No. 14/259,821, dated Jun. 15, 2018, 3 pages.
Examination Report for European Patent Application No. 13806028.0, dated Mar. 6, 2018, 7 pages.
Notice of Reasons for Rejection for Japanese Patent Application No. 2015-550411, dated May 9, 2017, 19 pages.
Decision of Rejection for Japanese Patent Application No. 2015-550411, dated Sep. 12, 2017, 10 pages.
Notice of Completion of Pretrial Examination for Japanese Patent Application No. 2015-550411, mailed Feb. 1, 2018, 4 pages.
Report of Reconsideration by Examiner before Appeal for Japanese Patent Application No. 2015-550411, dated Feb. 1, 2018, 6 pages.
Decision to Grant a Patent for Japanese Patent Application No. 2015-550412, dated Jan. 8, 2019, 4 pages.
Examiner's Answer for U.S. Appl. No. 15/344,735, dated Feb. 8, 2019, 11 pages.
Examiner's Answer for U.S. Appl. No. 14/259,821, dated Feb. 13, 2019, 13 pages.
Result of Consultation for European Patent Application No. 13806028.0, dated Mar. 14, 2019, 3 pages.
Decision to Refuse for European Patent Application No. 13806028.0, dated Apr. 18, 2019, 8 pages.
Decision of Rejection for Japanese Patent Application No. 2016-557300, dated Apr. 9, 2019, 6 pages.
Examination Report for European Patent Application No. 15745260.8, dated Jun. 24, 2019, 11 pages.
Trial and Appeal Decision for Japanese Patent Application No. 2015-550411, mailed Jul. 2, 2019, 35 pages.
Final Office Action for U.S. Appl. No. 14/212,991, dated Oct. 28, 2019, 27 pages.
Examination Report for European Patent Application No. 13811320.4, dated Oct. 22, 2019, 6 pages.
Pretrial Report for Japanese Patent Application No. 2016-557300, mailed Oct. 4, 2019, 11 pages.
Notice of Termination of Reconsideration by Examiners before Appeal Proceedings for Japanese Patent Application No. 2016-557300, mailed Oct. 23, 2019, 3 pages.
Summons to Attend Oral Proceedings for European Patent Application No. 13811320.4, mailed May 12, 2020, 5 pages.
Notice of Reasons for Rejection for Japanese Patent Application No. 2016-55730, dated Jun. 2, 2020, 15 pages.
Decision on Appeal for U.S. Appl. No. 15/344,735, dated Mar. 26, 2020, 18 pages.
Notice of Allowance for U.S. Appl. No. 15/344,735, dated Jun. 10, 2020, 8 pages.
Examiner's Answer to the Appeal Brief for U.S. Appl. No. 14/212,991, dated Jul. 24, 2020, 10 pages.
Decision on Appeal for U.S. Appl. No. 14/259,821, dated Jul. 22, 2020, 10 pages.
Intention to Grant for European Patent Application No. 13811320.4, dated Nov. 17, 2020, 11 pages.
Notice of Reasons for Refusal for Japanese Patent Application No. 2016-557300, dated Nov. 10, 2020, 13 pages.

* cited by examiner

TRANSISTOR STRUCTURES HAVING A DEEP RECESSED P+ JUNCTION AND METHODS FOR MAKING SAME

RELATED APPLICATIONS

This application is a continuation of U.S. patent application Ser. No. 13/730,068, filed on Dec. 28, 2012, now U.S. Pat. No. 10,115,815, the disclosure of which is hereby incorporated herein by reference in its entirety.

FIELD OF THE DISCLOSURE

The present disclosure relates to transistor structures, and in particular, transistor structures such as metal-oxide-semiconductor field-effect transistors (MOSFETs), and methods for making such transistor structures.

BACKGROUND

Metal-oxide-semiconductor field-effect transistors (MOSFETs) are well-known. In particular, power MOSFETs have been commercialized and are expected to be widely used in power systems. For traditional MOSFET structures, such as power MOSFETs on Silicon Carbide (SiC), one potential issue is the presence of a high electrical field at the gate oxide in the center of the junction field effect (JFET) region of the device. A JFET region generally is an active portion of an N-type drift layer which may include an N-type dopant and is located between two P-type wells or inside a P-type well. The JFET region may refer to a region in contact with channel regions coming up to the surfaces of the P-type wells by applying a gate voltage. The JFET region makes up a conduction path for electrons with the N+ source region, the channel region, the N-type drift region, the substrate, and the drain electrode. Under operation conditions at which a high bias is applied to the drain (close to the operational maximum) and in which the gate is held near ground potential, a high electrical field is created in the gate oxide that sits just above the JFET region. Imperfections in the interface material and gate oxide could result in a gate oxide failure during long-term blocking operation, in which the drain is placed under a high positive bias. Second, traditional MOSFETs also may suffer from possible hot carrier injection during long-term blocking condition, in which the drain is placed under a high positive bias.

SUMMARY

The present disclosure relates to a transistor device having a deep recessed P+ junction (or recessed P+ well). In one preferred embodiment, the transistor device is a MOSFET device and even more preferably a Silicon Carbide (SiC) MOSFET device. However, the transistor device may more generally be any type of device having a transistor (e.g., a power MOSFET; a double differentiated field effect transistor (DMOSFET); a trench gated metal-oxide-semiconductor field effect transistor (UMOSFET); an insulated gate bipolar transistor (IGBT); and the like).

In one embodiment, a transistor device having a deep recessed P+ junction is disclosed. The transistor device may comprise a gate and a source on an upper surface (or top surface) of the transistor device. The transistor device may further include at least one doped well region, wherein the at least one doped well region has a first conductivity type that is different from a conductivity type of a source region within the transistor device. The at least one doped well region is recessed from the upper surface of the transistor device by a depth. The deep recessed P+ junction may be a deep recessed P+ implanted junction within a source contact area. The deep recessed P+ junction may be deeper than a termination structure in the transistor device. The transistor device may be a Silicon Carbide (SiC) MOSFET device. In one embodiment, the deep recessed P+ junction may be a deep recessed P+ implanted junction within a source contact area. In one embodiment, the deep recessed P+ junction may be deeper than the termination.

In another embodiment, an alternative transistor device is disclosed. The transistor device comprises at least one sidewall and an upper surface, wherein a gate and a source are at least partially disposed on the upper surface. The transistor device comprises at least one source region of a first conductivity type and at least one well region of a second conductivity type adjacent to the at least one source region. The at least one well region is recessed from the upper surface of the transistor device to a depth. In addition, at least a portion of the upper surface and the sidewall of the transistor device is etched away to a recess depth as measured from the upper surface.

In yet another embodiment, a method of forming a transistor device is disclosed. The method includes providing a source and a gate on an upper surface of the transistor device. At least one source region and at least one well region is provided, wherein the at least one well region is recessed from the upper surface of the transistor device by a depth.

In yet another embodiment, an alternative method of forming a transistor device having at least one sidewall and an upper surface is disclosed. The method comprises providing a gate and a source on the upper surface of the transistor device. The method further includes providing at least one source region of a first conductivity type and providing at least one well region of a second conductivity type adjacent to the at least one source region. The at least one well region is recessed from the upper surface of the transistor device to a depth. The method also includes etching at least a portion of the upper surface and the sidewall of the transistor device to a recess depth as measured from the upper surface.

The transistor device having the deep recessed P+ junction described above may provide advantages relating to performance as compared to traditional MOSFETs. For example, the transistor device having the deep recessed P+ junction may provide a uniform avalanche path thoroughly within the active area. In addition, the transistor device having the deep recessed P+ junction also may result in reduced DIBL effect around the channel due to enhanced electrical field shielding, so that the threshold voltage could be increased. Further, the transistor device having the deep recessed P+ junction may also improve reliability under long-term blocking condition, in which the drain is placed under a high positive bias, due to a lower gate oxide field, and may also reduce the possibility of hot carriers injecting into the gate oxide during long-term blocking condition, in which the drain is placed under a high positive bias. Moreover, the transistor device having the deep recessed P+ junction may also provide a larger ohmic contact area. Finally, the transistor device having the deep recessed P+ junction may also result in a smaller chip size as the termination area conventionally occupied by guard rings or JTEs may be able to be eliminated.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
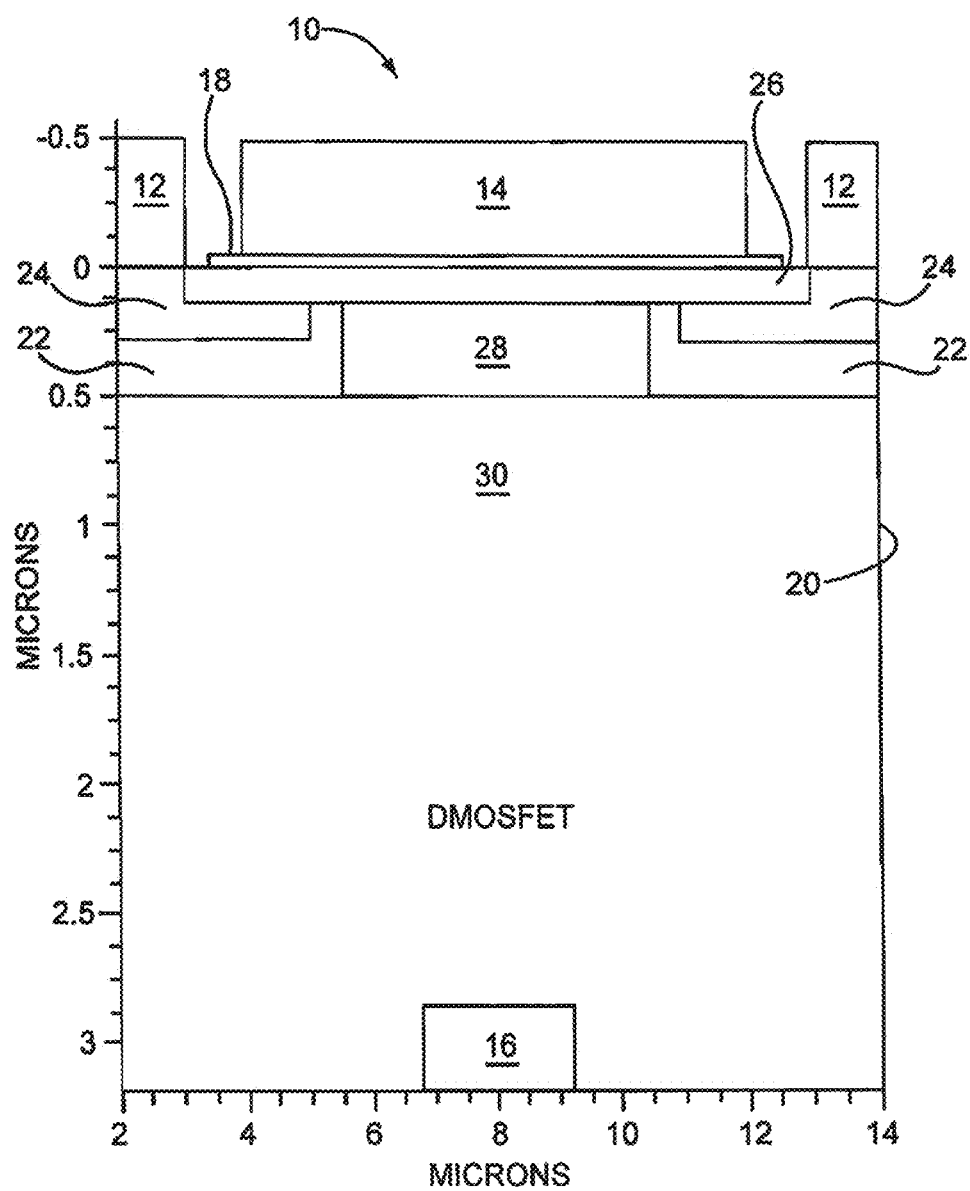
FIG. 1 is a double implanted field effect transistor (DI-MOSFET) having a buried channel.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

There is a need for a MOSFET structure that has reduced electrical field at the gate oxide interface, thus resulting in improved device reliability. One approach at addressing this issue is to narrow the JFET region of the MOSFET (also known as the JFET gap). However, it has been recognized by the inventors of the present application that narrowing down the JFET gap (without sacrificing forward voltage drop) on a conventional MOSFET device could improve the device reliability under high electrical field stressing, but it may not eliminate failure.

There is also a need for smaller die sizes for MOSFETs. In traditional MOSFETs, a termination area, which may include termination structures such as guard rings or junction termination extensions (JTEs), is typically required. The termination area is typically formed to surround an active region of the MOSFET, and its purpose is to reduce or prevent electrical field crowding at various points in the active area of the device. It may be desirable to eliminate the termination area conventionally occupied by guard rings or JTEs in order to have a smaller chip size. In order to do so, a different way of reducing or preventing electrical field crowding is necessary.

Further, for power MOSFETs, it may be beneficial to have the following features. First, it may be advantageous for the avalanche condition to occur within the active area of the MOSFET device instead of the termination area. Second, it may be desirable to effectively prevent drain induced barrier lowering (DIBL) for low drain leakage current and gate reliability. In addition, it may be advantageous to have good ohmic contact. Thus, there is a need for power MOSFETs to have these desired features without comprising performance of the MOSFETs.

The disclosure relates to a transistor device that has a new structure in order to reduce an electrical field at a gate oxide interface and significantly reduce or eliminate failure during long-term blocking condition, in which the drain is placed under a high positive bias. In particular, the present disclosure relates to a transistor device having a deep recessed P+ junction. In one preferred embodiment, the transistor device is a MOSFET device and even more preferably a Silicon Carbide (SiC) MOSFET device. However, the transistor device may more generally be any type of device having a transistor (e.g., a power MOSFET; a double implanted field effect transistor (DIMOSFET); a trench gated metal-oxide-semiconductor field effect transistor (UMOSFET); an insulated gate bipolar transistor (IGBT); and the like).

In one embodiment, a transistor device having a deep recessed P+ junction is disclosed. The transistor device may comprise a gate and a source on an upper surface of the transistor device. The transistor device may further include at least one doped well region, wherein the at least one doped well region has a first conductivity type that is different from a conductivity type of a source region within the transistor device. The at least one doped well region is recessed from the upper surface of the transistor device by a depth. The deep recessed P+ junction may be a deep recessed P+ implanted junction within a source contact area. The deep recessed P+ junction may be deeper than a termination structure in the transistor device. The transistor device may be a Silicon Carbide (SiC) MOSFET device. In one embodiment, the deep recessed P+ junction may be a deep recessed P+ implanted junction within a source contact area. In one embodiment, the deep recessed P+ junction may be deeper than the termination.

In another embodiment, an alternative transistor device is disclosed. The transistor device comprises at least one sidewall and an upper surface, wherein a gate and a source are at least partially disposed on the upper surface. The transistor device comprises at least one source region of a first conductivity type and at least one well region of a second conductivity type adjacent to the at least one source region. The at least one well region is recessed from the upper surface of the transistor device to a depth. In addition, at least a portion of the upper surface and the sidewall of the transistor device is etched away to a recess depth as measured from the upper surface.

Before specifically describing various embodiments of the present disclosure, a discussion is provided of research conducted by the inventors that will enable better understanding of the transistor devices disclosed herein.

FIG. 1 illustrates a MOSFET device 10 that does not have reduced electrical field at the gate oxide interface. In FIG. 1, the MOSFET device 10 is a traditional DMOSFET. The traditional DMOSFET 10 includes a source 12, a gate 14, and a drain 16 positioned on a semiconductor body 20 with the gate 14 atop an oxide layer 18 insulating the gate region.

The DMOSFET 10 includes a P+-type well 22 implanted into the semiconductor body 20 to a depth of about 0.5 microns and doped to an appropriate level. In one embodiment, the dopant level may be between about $5 \times 10^{18}$ cm$^{-3}$ and $5 \times 10^{20}$ cm$^{-3}$, although other dopant levels could be used. An N+ source region 24 doped to an appropriate level, such as approximately $5 \times 10^{19}$ cm$^{-3}$ in one embodiment (although other dopant levels may be used), is adjacent the P+-type well 22 and positioned between the P+-type well 22 and a buried channel 26. The buried channel 26 extends across portions of the source region 24, the P+-type well 22 and the semiconductor body 20 between active regions, i.e., a JFET region 28. A JFET region generally is an active portion of an N-type drift layer which may include an N-type dopant and is located between two N-type wells or inside a P-type well. The JFET region may refer to a region in contact with channel regions coming up to the surfaces of the P-type wells by applying a gate voltage. The JFET region makes up a conduction path for electrons with the N+ source region, the channel region, the N-type drift region, the substrate, and the drain electrode. The buried channel 26, the JFET region 28, and a supporting drift region 30 of the DMOSFET 10 are doped to appropriate levels. In one embodiment, the buried channel 26 may be doped between about $1 \times 10^{16}$ cm$^{-3}$ and $1 \times 10^{17}$ cm$^{-3}$, the JFET region 28 may be doped between about $2 \times 10^{16}$ cm$^{-3}$ and $5 \times 10^{16}$ cm$^{-3}$, and the supporting drift region 30 may be doped between about $2 \times 10^{14}$ cm$^{-3}$ and $5 \times 10^{16}$ cm$^{-3}$, although other dopant levels could be used.

In a typical DMOSFET, the fabrication process controls the channel surface by using ion implantation instead of doping during layer growth. Ion implantation is difficult to achieve accurately in DMOSFETs, and the resulting devices are limited in channel mobility. In addition, the traditional DMOSFET 10 shown in FIG. 1 may have a high electrical field at the gate oxide in the center of the JFET region 28 of the device. The high electrical field combined with any imperfections in the interface material and gate oxide could result in a gate oxide failure under long-term blocking condition, in which the drain is placed under a high positive bias. Also, the traditional DMOSFET 10 shown in FIG. 1 may suffer from possible hot carrier injection during long-term blocking condition, in which the drain is placed under a high positive bias.

Figure 2:
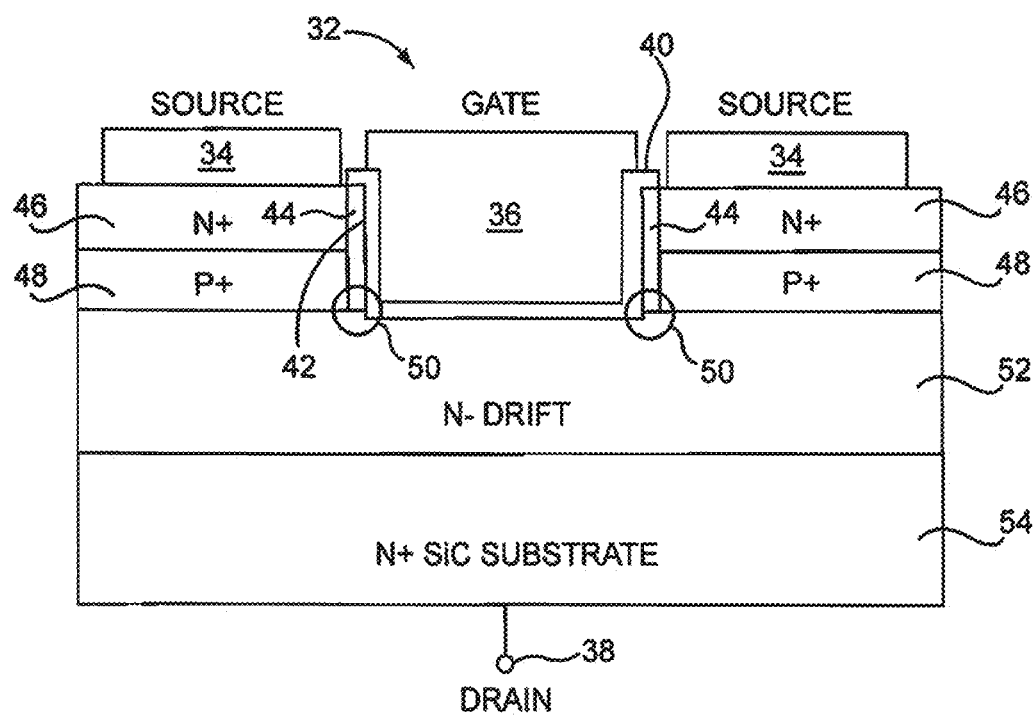
FIG. 2 is a trenched gate field effect transistor (UMOS-FET) having a conductive channel along the vertical trench wall.

FIG. 2 shows a traditional UMOSFET 32, which suffers similar current restrictions and similar problems with high electrical field. As set forth in FIG. 2, the traditional UMOSFET 32 includes a standard source 34, gate 36, and drain 38 with the gate 36 atop an oxide layer 40 lining a trench 42. The oxide layer 40 extends across at least a portion of the gate 36. The buried channel 44 of the traditional UMOSFET 32 extends across the source 34 and down into the trench 42 such that the buried channel 44 is between epitaxial layers of the P-N junction 46, 48, and the oxide layer 40. The problem with the related art traditional UMOSFET 32 is that the corner of trench 50 exhibits a noted crowding of the electric field at the corner of the trench 50, inhibiting current flow through drift region 52 and substrate 54 (which may be any made of any material, but may be a N+ silicon carbide substrate in one embodiment) down to the drain 38. The electric field crowding also results in a lower sustained gate voltage during reverse bias operation.

The traditional UMOSFET 32 of FIG. 2 also requires a trench that is greater than two microns for proper gate placement and operation. Given that reactive ion etching is often the method of choice for forming a trench in a UMOSFET, the trench wall is so severely damaged in the fabrication process that the conductive channel is constricted. Uniform results are difficult to achieve when subjecting silicon carbide to reactive ion etching, and resulting devices are not reliable. The damage caused by the reactive ion etching also deteriorates oxide quality formed thereon for insulation purposes. These factors combined in related art UMOSFETs require an on-voltage of up to 30 volts for forward conduction.

Figure 3:
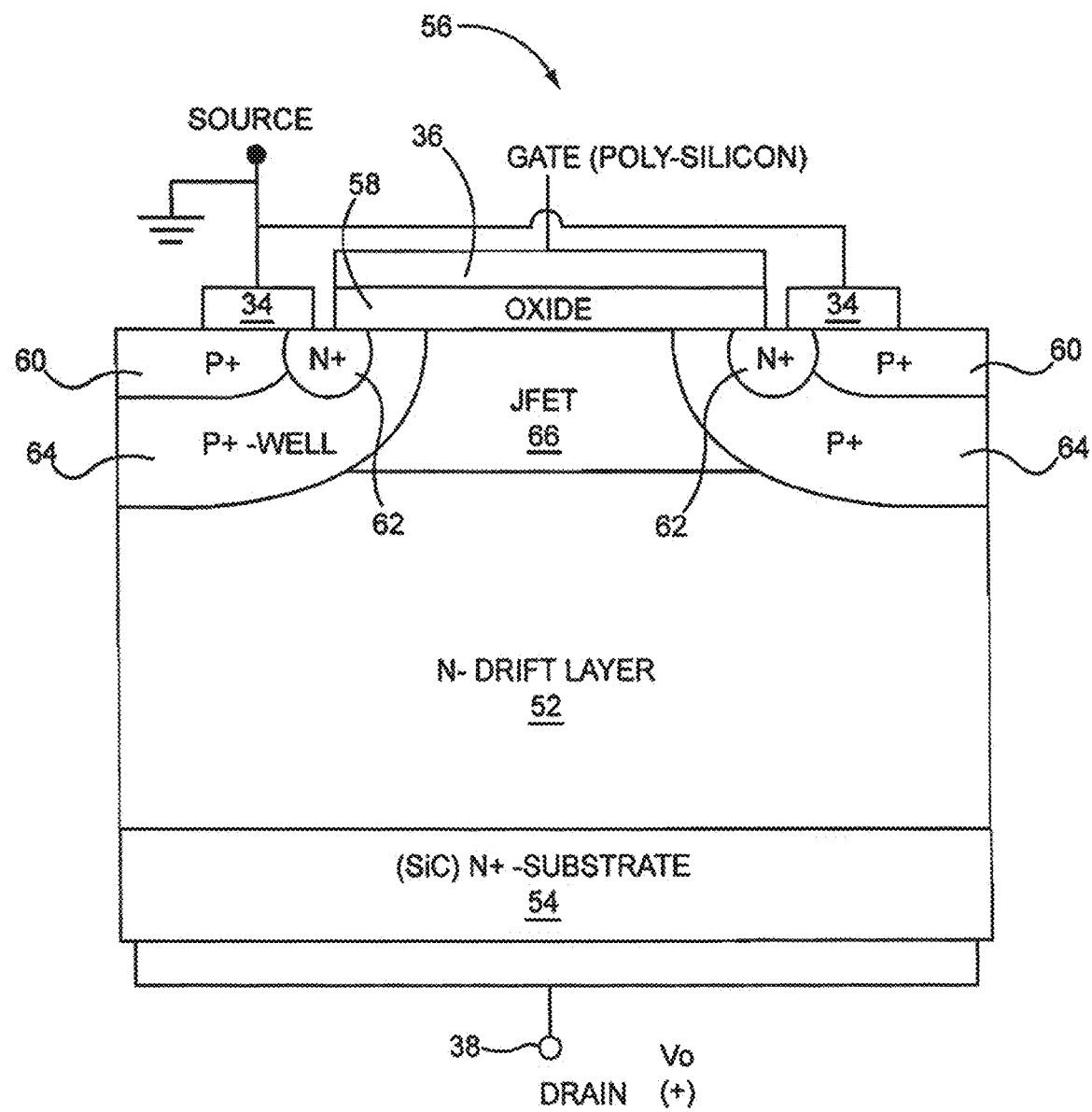
FIG. 3 is another embodiment of a standard MOSFET cell that does not have reduced electrical field at the gate oxide interface.

FIG. 3 shows another embodiment of a standard DMOSFET cell that does not have reduced electrical field at the gate oxide interface. In FIG. 3, a DMOSFET 56 includes a source 34, a gate contact 36, and a drain 38 positioned on a body of the DMOSFET with the gate contact 36 atop an oxide layer 58 insulating the gate region. The DMOSFET 56 includes a least one P+-type well region 64 implanted into the body of the DMOSFET having at least one P+ region 60. At least one N+ source region 62 doped to an appropriate level, such as approximately $5 \times 10^{19}$ cm$^{-3}$ in one embodiment, is adjacent the at least one P+ region 60. A JFET region 66 is located underneath the oxide layer 58 and is doped to appropriate levels. A JFET region generally is an active portion of an N-type drift layer which may include an N-type dopant and is located between two P-type wells or inside a P-type well. The JFET region may refer to a region in contact with channel regions coming up to the surfaces of the P-type wells by applying a gate voltage. The JFET region makes up a conduction path for electrons with the N+ source region, the channel region, the N-type drift region, the substrate, and the drain electrode. A supporting drift region 52 of the DMOSFET 56 is also doped to appropriate levels, such as between about $1 \times 10^{14}$ cm$^{-3}$ and $5 \times 10^{16}$ cm$^{-3}$ in one embodiment, and is supported by a substrate 54 (which may be any made of any material, but may be a N+ silicon carbide substrate in one embodiment) down to the drain 38. In a typical related art DMOSFET, the fabrication process controls the channel surface by using ion implantation instead of doping during layer growth. Ion implantation is difficult to achieve accurately in DMOSFETs, and the resulting devices are limited in channel mobility. In addition, the DMOSFET 56 shown in FIG. 3 also may have a high electrical field at the gate oxide in the center of the JFET region 66 of the device. The high electrical field combined with any imperfections in the interface material and gate oxide could result in a gate oxide failure under long-term blocking condition, in which the drain is placed under a high positive bias. Also, the DMOSFET 56 shown in FIG. 3 may suffer from possible hot carrier injection during long-term blocking condition, in which the drain is placed under a high positive bias.

The related art DMOSFET and UMOSFET devices in FIGS. 1-3 illustrate the common need for modifications to transistor design that reduces the electrical field at the gate oxide interface and increases maximum current flow in the on state with the ability to block incident voltages in reverse biased operation. For illustrative purposes, assume that the substrate and the drift layer of the devices shown in FIGS. 1-3 are each formed of Silicon Carbide (SiC). However, other semiconductor materials may be used.

Further, for the types of devices shown in FIGS. 1-3, there is typically a voltage rating. For example, the device may be rated at 1200 volts (1200 V). For reliability purposes, the traditional transistor devices must be overdesigned, for example, to handle voltages up to 1600 V or so, in order to make sure there is adequate voltage blocking at 1200 V. It may be desirable to not have to overdesign to 1600 V, and further to have an avalanche effect (also known as avalanche breakdown) at 1200 V. Avalanche breakdown is a phenomenon that can occur in both insulating and semiconducting materials. It is a form of electric current multiplication that can allow very large currents within materials which are otherwise good insulators. It is a type of avalanche. The avalanche process occurs when the carriers in the transition region are accelerated by the electric field to energies sufficient to free electron-hole pairs via collisions with bound electrons.

In general, materials conduct electricity if they contain mobile charge carriers. There are two types of charge carrier in a semiconductor: free electrons and electron holes. A fixed electron in a reverse-biased diode may break free due to its thermal energy, creating an electron-hole pair. If there is a voltage gradient in the semiconductor, the electron will move towards the positive voltage while the hole will "move" towards the negative voltage. Most of the time, the electron and hole will just move to opposite ends of the crystal and stop. Under the right circumstances, however, (i.e. when the voltage is high enough) the free electron may move fast enough to knock other electrons free, creating more free-electron-hole pairs (i.e. more charge carriers), increasing the current. Fast-"moving" holes may also result in more electron-hole pairs being formed. In a fraction of a nanosecond, the whole crystal begins to conduct. Certain avalanche capable devices are designed to break down this way at low voltages and can survive the reverse current. The voltage at which the breakdown occurs is called the breakdown voltage. There may also be a hysteresis effect; once avalanche breakdown has occurred, the material will continue to conduct if the voltage across it drops below the breakdown voltage. When both sides of the pn junction (called a depletion layer) which is lightly doped become large enough avalanche breakdown takes place.

One approach at addressing high electrical field at the gate oxide interface is to narrow the JFET gap. However, it has been recognized by the inventors of the present invention that narrowing down the JFET gap (without sacrificing forward voltage drop) on a conventional MOSFET device could improve the device reliability during long-term blocking condition, in which the drain is placed under a high positive bias, but it may not eliminate failure.

In order to reduce the electrical field at the gate oxide interface and eliminate failure during long-term blocking condition, in which the drain is placed under a high positive bias, as well as to provide for the avalanche condition to occur within the active area of the MOSFET device instead of the termination area, a new transistor structure is proposed. A deep recessed P+ junction is incorporated within the transistor structure. In one embodiment, the deep recessed P+ junction is a deep recessed P+ implanted junction within a source contact area. In one embodiment, the deep recessed P+ junction may be deeper than the termination.

Figure 4:
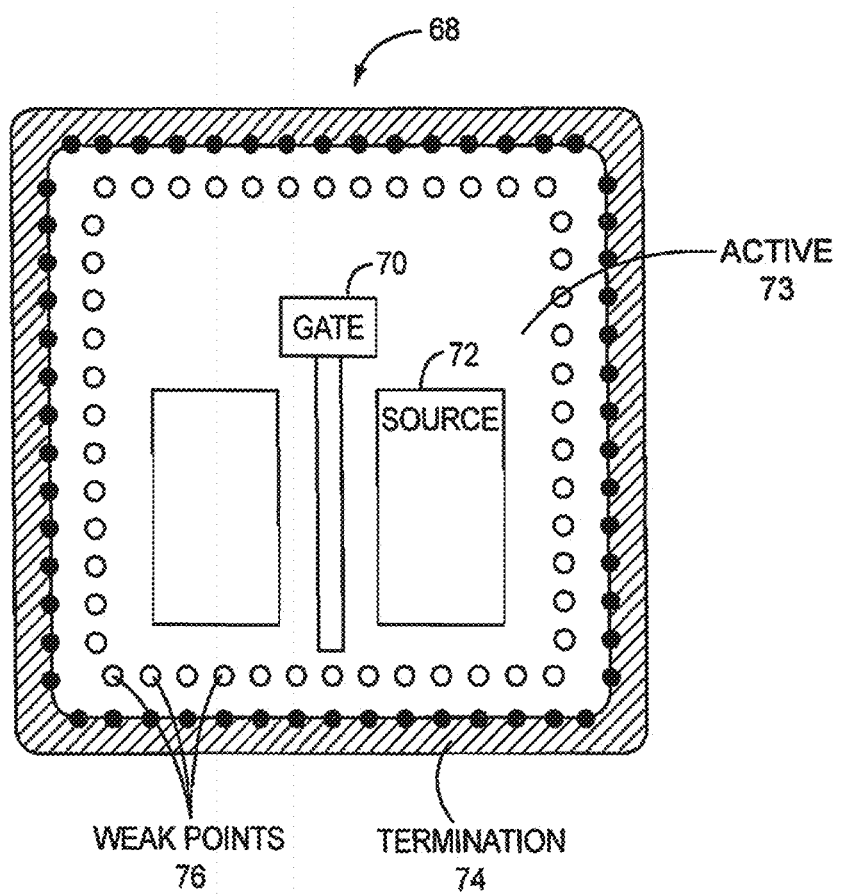
FIG. 4 is a top view of a transistor device according to one embodiment.

Referring now to FIG. 4, FIG. 4 is a top view of a transistor device according to one embodiment. A transistor device 68 has a gate 70 and a source 72. The transistor device 68 has an active area 73 and a termination area 74. Assuming that the transistor device 68 is rated for a particular voltage and power, the transistor device 68 will have a certain avalanche voltage. For a given power level and a given avalanche voltage, there will be a fixed avalanche current. Power will be dissipated along the narrow termination area 74, and the power density will be high. It may be desired to have the power dissipate wholly within the active area 73. One approach is to introduce localized weak points 76 within the active area. Because the breakdown voltage is proportional to a thickness of the drift layer, the thickness of the drift layer can be reduced to reduce the breakdown voltage and increase the avalanche current, but still maintain a high yield for the transistor device.

Figure 5A:
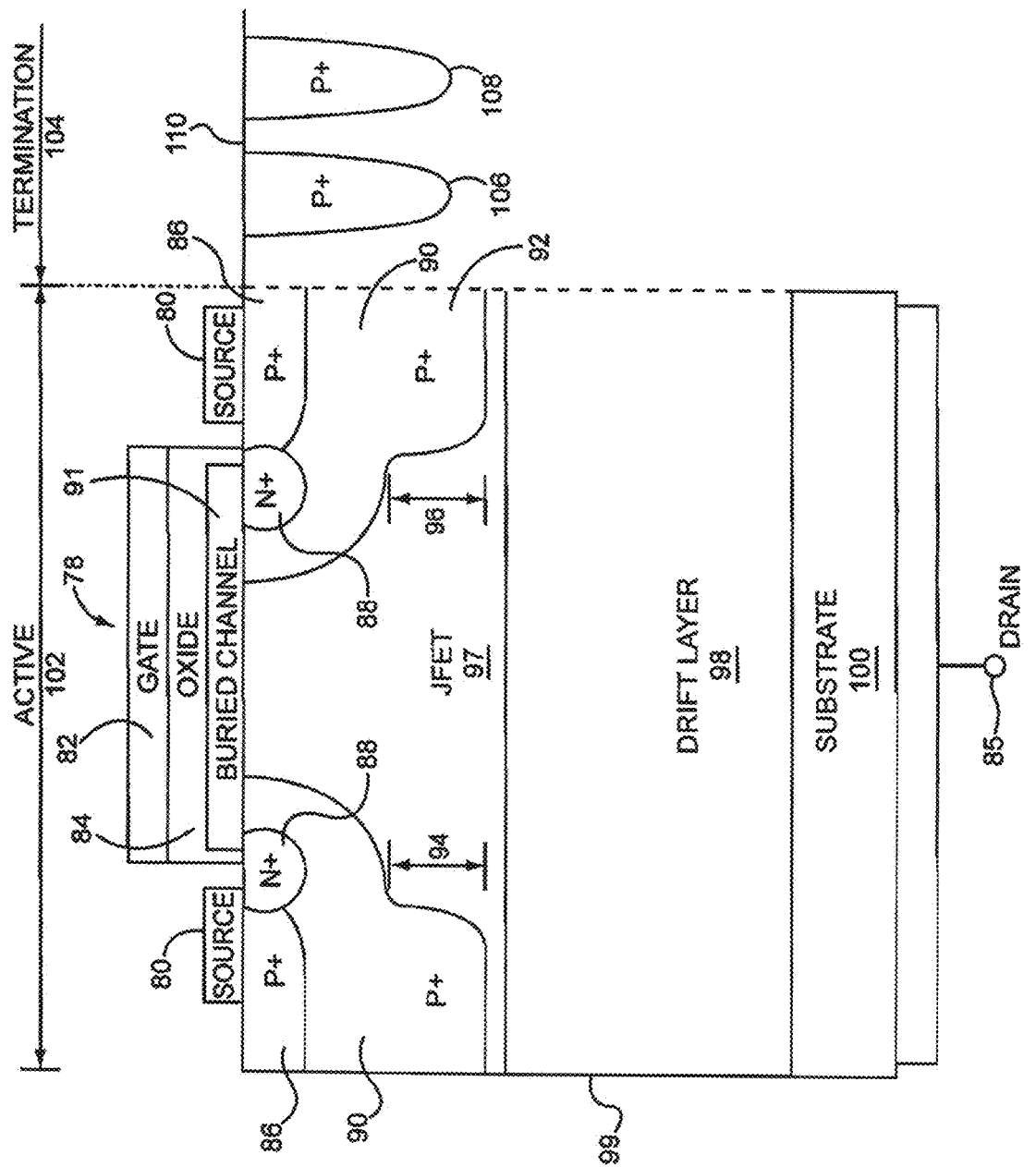
FIG. 5A is a cross section view of a transistor device having an active area and a termination area according to one embodiment.

Referring now to FIG. 5A, FIG. 5A illustrates a device 78 that has reduced electrical field at the gate oxide interface due to the introduction of deep recessed P+ junction. In FIG. 5A, the device 78 is a DMOSFET, but the device could be any type of device having a source, a gate, a gate oxide layer, a P+ well, and a JFET region, including but not limited to MOSFETs, UMOSFETs, AMOSFETs, IGBTs, and the like. Like the traditional DMOSFET shown in FIG. 1, the transistor device 78 may include a source 80 and a gate contact 82 with the gate contact 82 atop an oxide layer 84 insulating the gate region. The device 78 may also include a drain 85. The device 78 may include a P+ region 86 and an N+ source region 88 doped to appropriate levels. In one embodiment, the P+ region 86 may be doped between about $5 \times 10^{18}$ cm$^{-3}$ and $5 \times 10^{20}$ cm$^{-3}$ in one embodiment, and N+ source region 88 may be doped to a level approximately $5 \times 10^{19}$ cm$^{-3}$ in one embodiment. The device 78 may also include one or more P+-type wells 90. A typical P+-type well 90 is implanted into the device to a depth of about 0.5 microns and doped to an appropriate level, such as between about $5 \times 10^{18}$ cm$^{-3}$ and $5 \times 10^{20}$ cm$^{-3}$ in one embodiment.

In the present disclosure, a deeper P+ junction is provided such that the depth of the P+ junction is greater than the typical depth of 0.5 microns. The N+ source region 88 is adjacent the P+-type well 90 and positioned between the P+-type well 90 and a buried channel 91. The buried channel 91 may extend across portions of the device between active regions, i.e., a JFET region 97. A JFET region generally is an active portion of an N-type drift layer which may include an N-type dopant and is located between two P-type wells or inside a P-type well. The JFET region may refer to a region in contact with channel regions coming up to the surfaces of the P-type wells by applying a gate voltage. The JFET region makes up a conduction path for electrons with the N+ source region, the channel region, the N-type drift region, the substrate, and the drain electrode. The transistor device 78 also has a supporting drift layer 98 and a substrate 100. The buried channel 91, the JFET region 97, and supporting drift region 98 of the device may be doped to appropriate levels. In one embodiment, the buried channel 91 may be doped between about $1 \times 10^{16}$ cm$^{-3}$ and $1 \times 10^{17}$ cm$^{-3}$, the JFET region 97 may be doped between about $2 \times 10^{16}$ cm$^{-3}$ and $5 \times 10^{16}$ cm$^{-3}$, and the supporting drift region 98 may be doped between about $2 \times 10^{14}$ cm$^{-3}$ and $5 \times 10^{16}$ cm$^{-3}$, although other dopant levels could be used. The device 78 may be comprised of an active area 102 and a termination area 104. The termination area 104 may comprise termination structures, such as P+ areas 106 and 108 and guard ring 110. In other embodiments, the termination area 104 may also include JTEs (not shown).

In the proposed new structure, a deeper recessed P+ junction having a recess depth 94, 96 is implanted within the source contact area of the transistor device. In one embodiment, as shown on the left side of the transistor device 78 in FIG. 5A, the P+-type well 90 may be originally formed having a depth that is deeper than a typical P+-type well of 0.5 microns by a recess depth 94. In the alternative, as shown on the right side of the transistor device 78 in FIG. 5A, a typical P+-type well 90 may be implanted into the device to a depth of about 0.5 microns and doped to an appropriate level. Then, a recess portion 92 of the P+-type well 90 having a recess depth 96 may be formed such that the extended P+-type well 90 has a portion whose depth is the standard 0.5 microns plus the recess depth 96.

In one embodiment, the recess depth 94 or 96 may either be such that the P+-type well 90, 92 is deeper than a termination structure in the termination area, such as termination structures 106 and 108. The recess depth 94 or 96 may range from 0.2 microns to 1.0 micron such that the total depth of the P+-type well 90, 92 as measured from an upper surface of the transistor device 78 is approximately 0.7 to 1.5 microns. In one embodiment, the recess depth 94 or 96 may either be approximately 0.3 microns such that the total depth of the P+-type well 90, 92 as measured from an upper surface of the transistor device 78 is approximately 0.8 microns. In another embodiment, the recess depth 94 or 96 may either be approximately 0.45 microns such that the total depth of the P+-type well 90, 92 as measured from an upper surface of the transistor device 78 is approximately 0.95 microns. In another embodiment, the recess depth 94 or 96 may be approximately 0.6 microns such that the total depth of the P+-type well 90, 92 as measured from an upper surface of the transistor device 78 is approximately 1.1 microns. However, the recess depth 94, 96 may be any depth that results in the advantages described herein. One of the advantages realized by the deeper recessed P+ wells is to increase the avalanche current and allow for the avalanche condition to occur within the active area of the MOSFET device instead of the termination area.

Figure 5B:
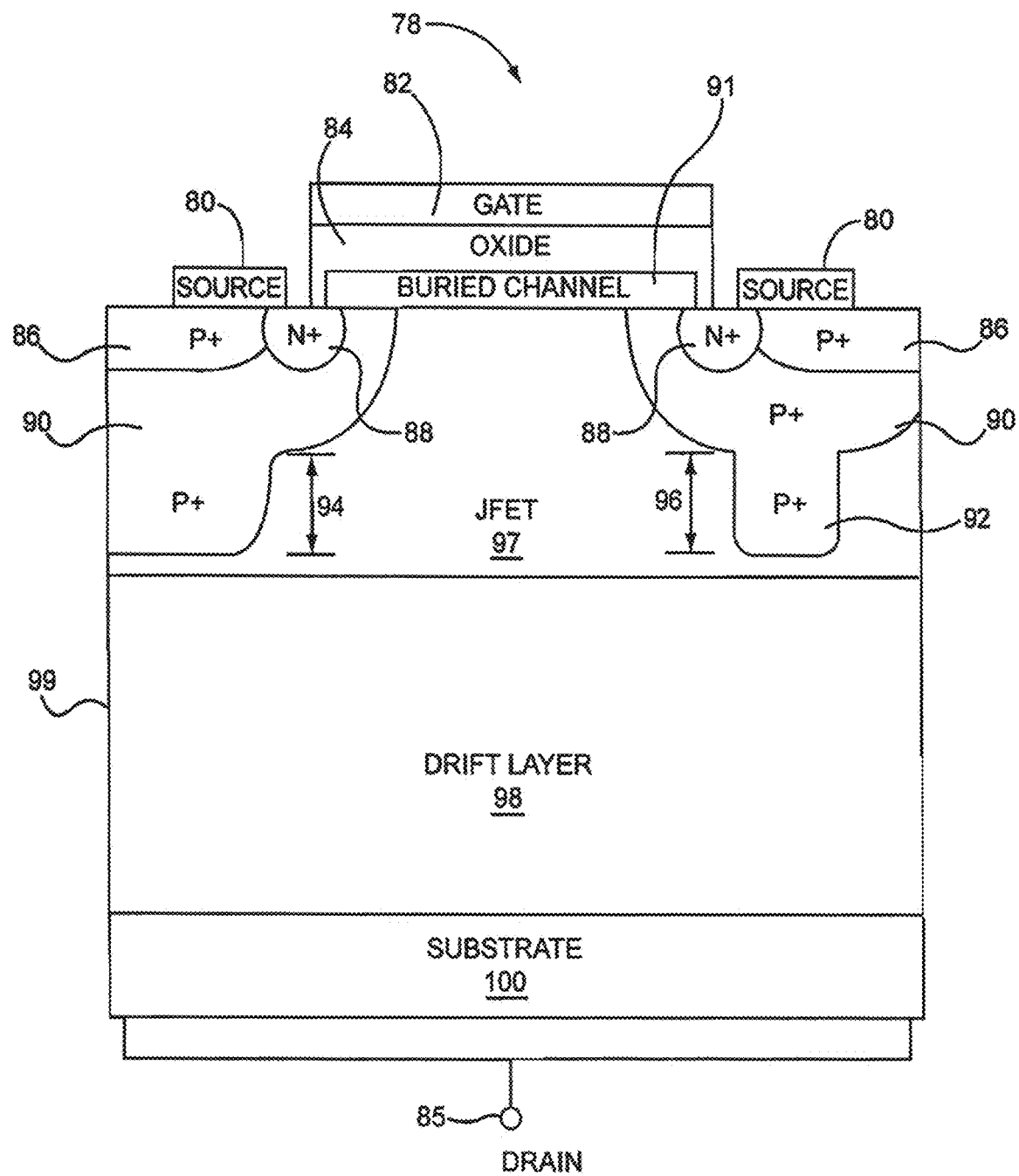
FIG. 5B is a cross section view of a transistor device having a deep recessed P+ junction and no termination area according to one embodiment.

By realizing this advantage, the termination area 104 may be able to be eliminated from the device 78, as shown in FIG. 5B. FIG. 5B is a cross section view of the device 78 of FIG. 5A having a deep recessed P+ junction, but no termination area. Since the deeper recessed P+ wells 90, 92 increase the avalanche current and allow for the avalanche condition to occur within the active area of the MOSFET device instead of the termination area, the device 78 may be manufactured without a termination area.

The deep recessed P+ junctions may be formed by any known methods, including but not limited to ion implantation. The method of forming the improved transistor structure described herein enhances technology that has been advantageously used for MOSFETs of the related art. The traditional methods, however, are modified to account for the fact that the transistor device includes a deeper recessed P+ junction, which in one embodiment, is in the source contact area of the transistor device. As noted above, MOSFETs according to this invention optionally include a silicon carbide substrate formed by known means. Referring back to FIG. 3 as an example, a drift region layer 52 of 4H-SiC is epitaxially grown on a substrate 54. The method includes forming at least one doped well region 64 of a first conductivity type, preferably P+. The well region 64 can be formed by any common technique, including but not limited to implanting dopants into the device from the top of the device down to a depth that is greater than one micron. A second layer 62 of a second conductivity type (such as N+ in one embodiment) is formed on the first layer 64. The body of the transistor device at this point includes semiconductor layers, preferably of silicon carbide, for controlling electrical conduction from top to bottom.

The next step in the process of this invention is that of the etching the epitaxial layers, particularly the epitaxial layers 62 and 64 to form a trench, which preferably extends to a depth that is less than the depth of doped well region 64, and form layer 60 by implantation. A buried channel layer is formed over at least a portion of the second epitaxial layer 62. Afterwards, the channel is covered with a layer of gate insulation (gate oxide 58), such as silicon dioxide, on which the gate contact 36 is formed. Source and drain contacts 34 and 38, common in these types of transistors, complete the transistor device. Referring now to FIGS. 5A and 5B, one or more deep recessed P+ junctions 90, 92 may be formed.

The method described herein can also be used to form other transistors that have a deep recessed P+ junction. Accordingly, this invention is not limited to various MOSFETs, but is equally applicable to insulated gate bipolar transistors and metal-oxide-semiconductor controlled thyristors. The semiconductor material used for forming all of these devices is preferably silicon carbide, but the invention is not limited to such.

Figure 6:
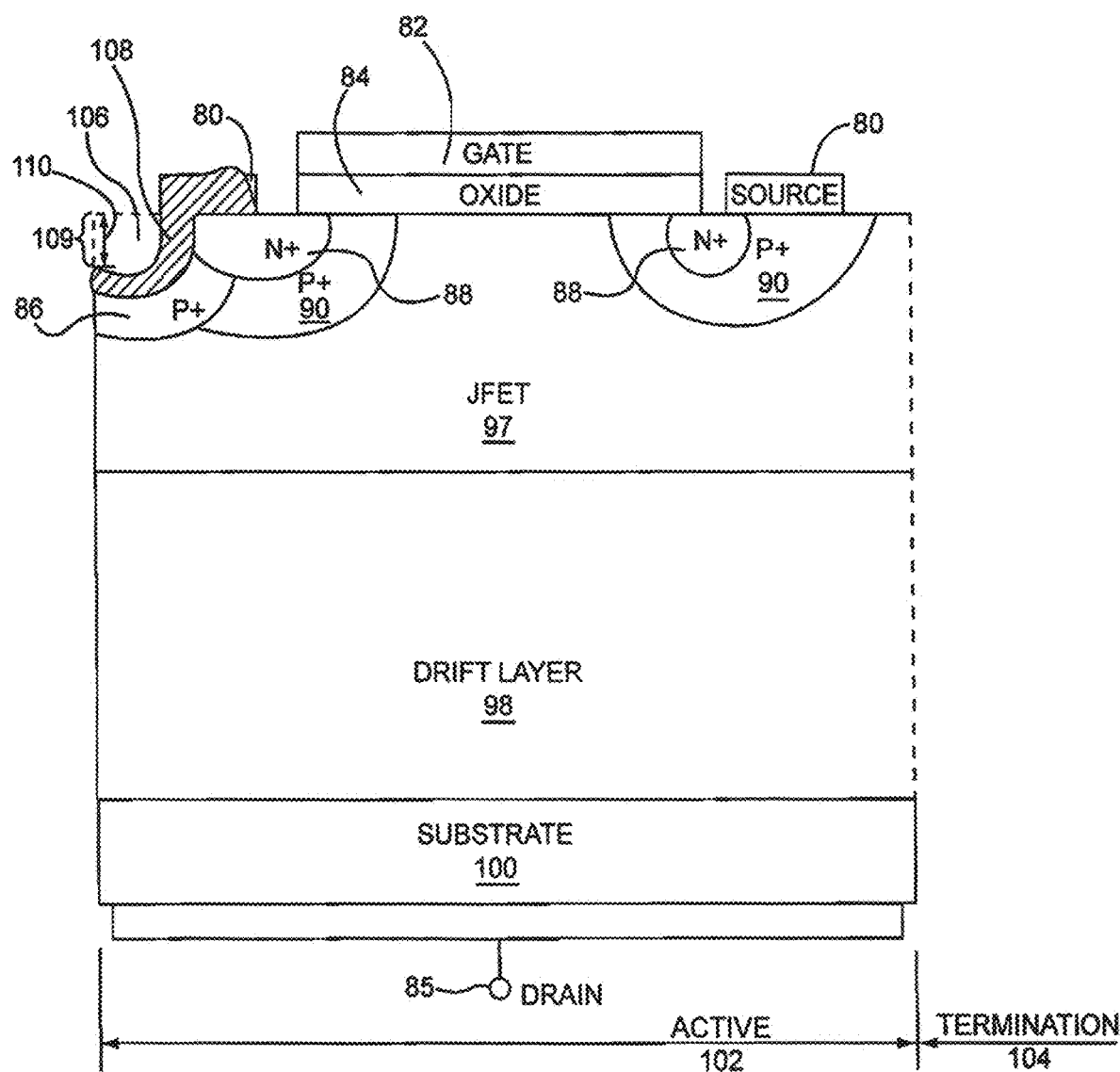
FIG. 6 is a cross section view of an alternate transistor device according to one embodiment.

To modify the traditional transistor structure, the deep recessed P+ junction of FIGS. 5A and 5B may be formed by the methods described above. However, in another embodiment, the deep recessed P+ junctions 90, 92 may be formed by etching an upper surface of the transistor device, as shown in FIG. 6. FIG. 6 is a cross section view of an alternate transistor device, wherein an upper surface is etched away to form the deep recessed P+ wells 90. The transistor device shown in FIG. 6 may be similar to the devices shown in FIGS. 5A and 5B. To obtain the deep recessed P+-type well 90, a portion 106 is etched away, which includes at least a portion of an upper surface of the device. In one embodiment, as shown in FIG. 6, the portion 106 is in a source contact area of the device. In fact, in one embodiment, at least a portion of the source 80 is also etched away. In another embodiment, at least a portion of the P+ region 86 is also etched away. The etching may result in an improved ohmic contact 108. In another embodiment, at least a portion of a sidewall 109 of the device is also etched away to a recess depth 110. In one embodiment, the recess depth 110 may be such that the P+-type well 90 is deeper than the termination area. The recess depth 110 may range from 0.2 microns to 1 micron. In one embodiment, the recess depth 110 may be approximately 0.3 microns. In another embodiment, the recess depth 110 may be approximately 0.45 microns. In another embodiment, the recess depth 110 may be approximately 0.6 microns. However, the recess depth 110 may be any depth that results in the advantages described herein.

The improved ohmic contact 108 may also be beneficial in allowing the size of the device to be reduced. In general, it may be desirable to have as low an ohmic resistance as possible and as low a capacitance as possible for a device, which can be done with a cell having a small cell pitch (width of cell). However, in general, many smaller cells have poor ohmic contact. Reducing the sidewall area, as shown in FIG. 6, both provides the deep recessed P+ junction and its accompanying advantages, as well as providing a better ohmic contact area for the device.

Figure 7:
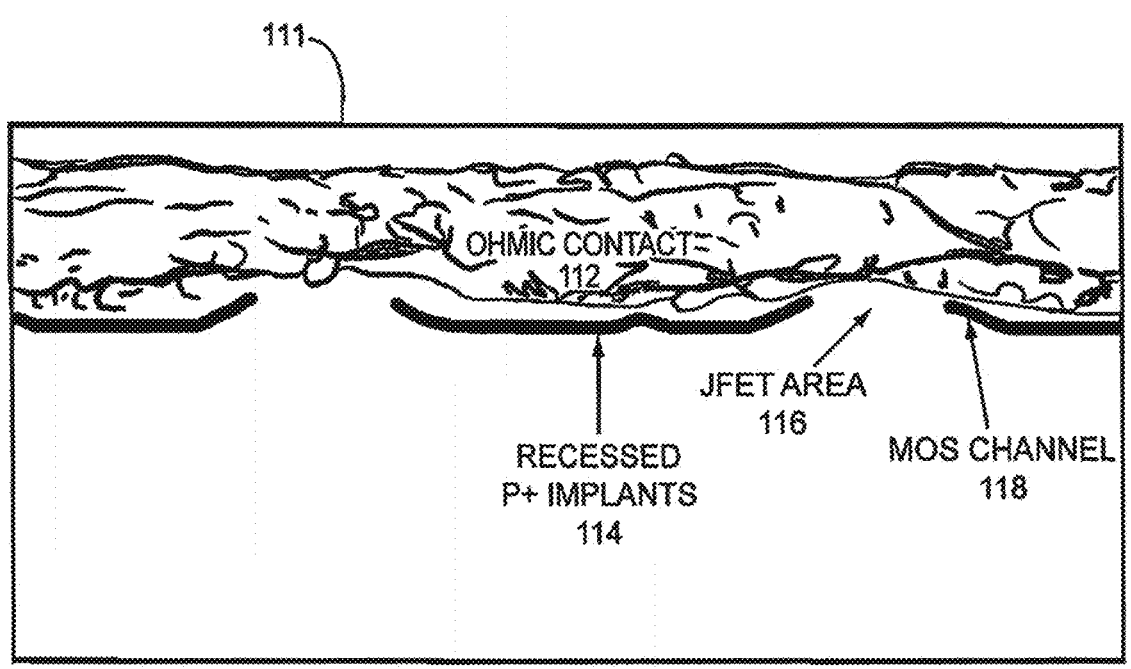
FIG. 7 is a Focused Ion Beam (FIB) cross section of a MOSFET having recessed P+ implants in an active areas of the MOSFET.

FIG. 7 is a Focused Ion Beam (FIB) cross section of a MOSFET having recessed P+ implants in an active area of the MOSFET. A transistor device 111 is illustrated having an ohmic contact 112, recessed P+ implants 114, an active JFET area 116, and a MOS channel 118. Due to the presence of the recessed P+ implants 114, the ohmic contact 112 is improved and a uniform avalanche path is created entirely within the active JFET area 116. In addition, the recessed P+ implants 114 will reduce any electrical field at the gate oxide, which improves long-term reliability under blocking operation, during which the drain is placed under a high positive bias, as well as provides a reduced DIBL effect around the MOS channel 118.

Figure 8:
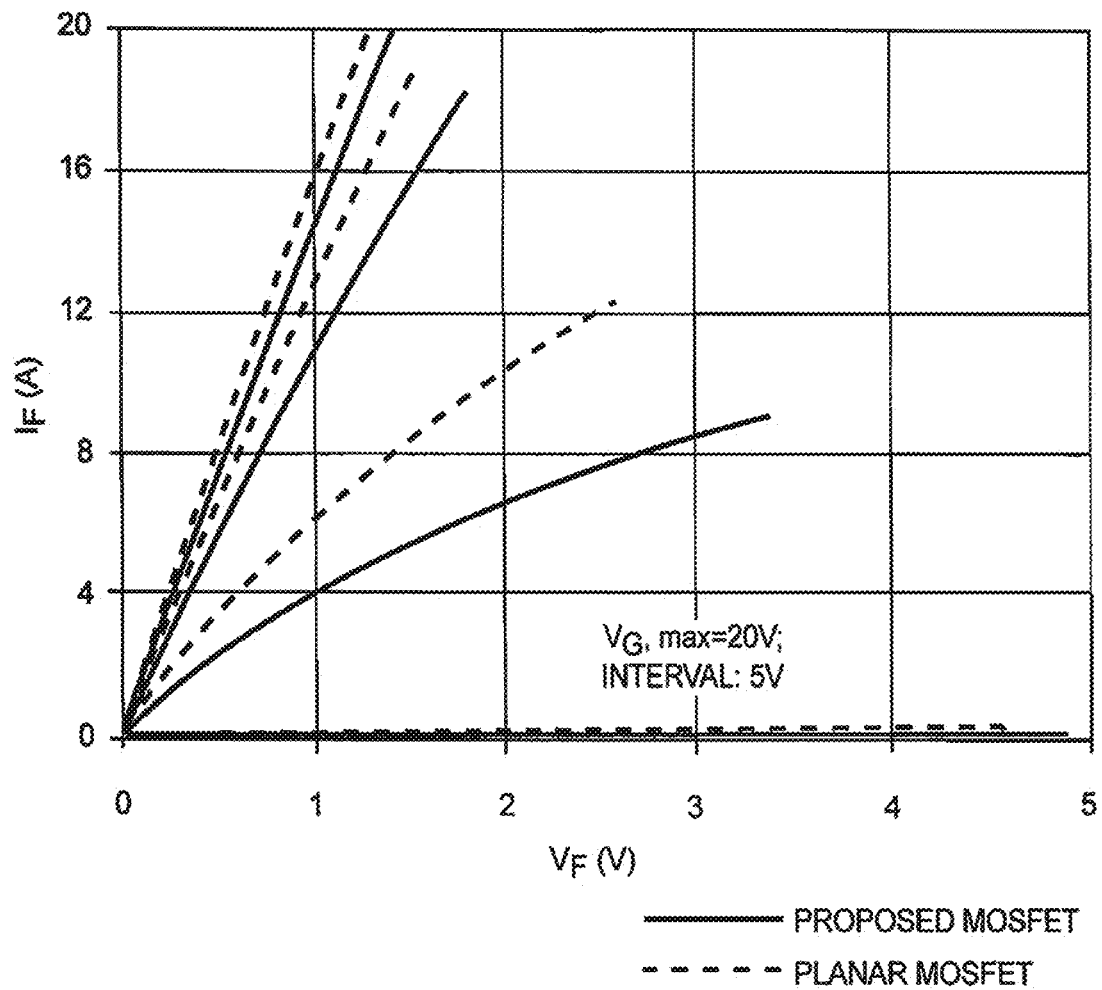
FIG. 8 is a graphical representation of the forward IV curves for a traditional MOSFET and a MOSFET having the deep recessed P+ junction according to one embodiment.
Figure 9:
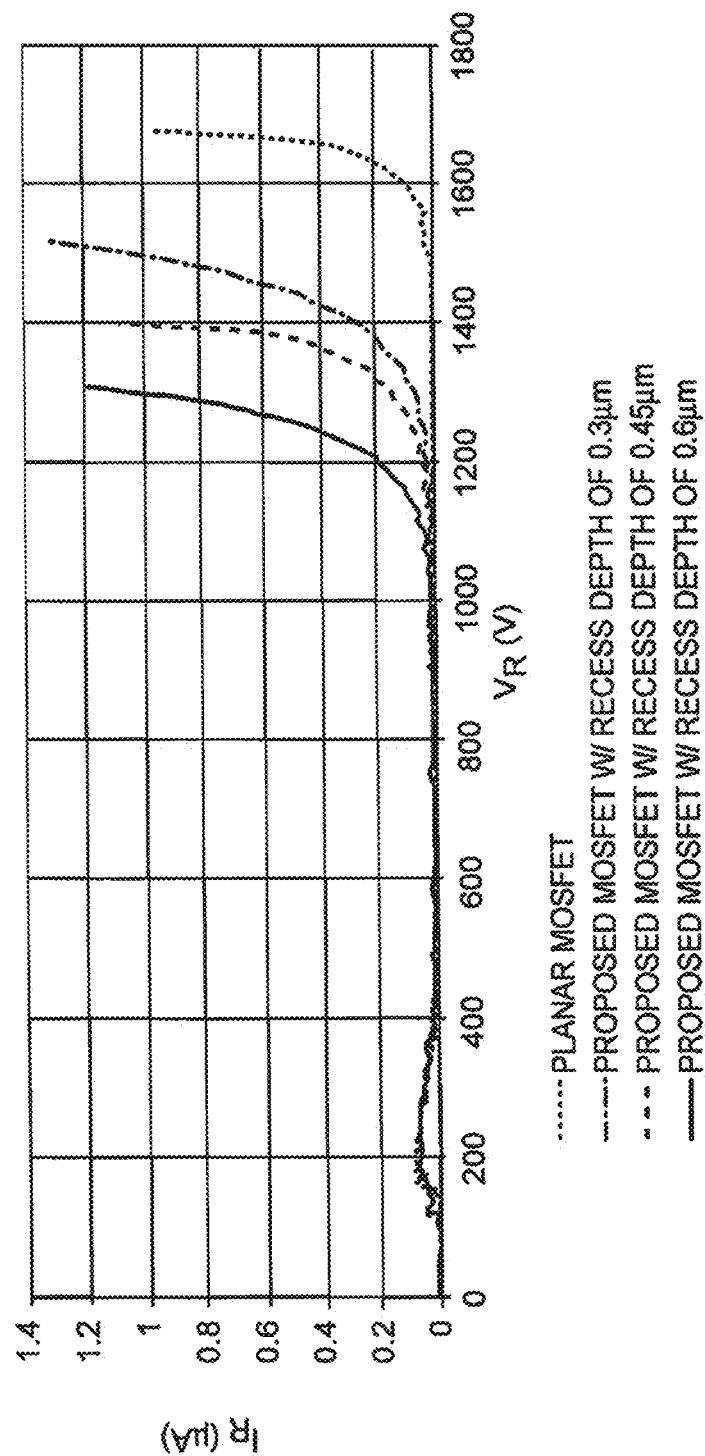
FIG. 9 is a graphic of reverse blocking voltage characteristics for a traditional MOSFET and for MOSFETs having a deep recessed P+ junction of various depths.

The advantages of the deep recessed P+ junction can be seen further in FIGS. 8 and 9. FIG. 8 is a graphical representation of the forward IV curves for a traditional MOSFET and a MOSFET having the deep recessed P+ junction according to one embodiment. FIG. 9 is a graphic of reverse blocking voltage characteristics for a traditional MOSFET and for MOSFETs having a deep recessed P+ junction of various depths.

FIG. 8 indicates that a MOSFET having a deeper recessed P+ junction has similar forward conduction performance as a traditional MOSFET, while the threshold voltage has been increased. In FIG. 8, the line on the graph labeled PROPOSED MOSFET is a MOSFET having a recess depth of 0.6 microns (see recess depth 94, 96 in FIG. 5A and recess depth 110 in FIG. 6). In addition, when testing the disclosed embodiments, voltage maps have indicated that threshold voltage has increased for various recess depths of 0.3 microns, 0.45 microns, and 0.6 microns. The threshold voltage for the MOSFET having a 0.6 micron recess depth has been increased by more than 0.5 V, as shown in testing. In one sample test, the traditional MOSFETs had a threshold voltage of approximately 2.8 V, where the proposed MOSFETs disclosed herein having a recess depth of about 0.3 microns had a threshold voltage of approximately 3.1 V, the proposed MOSFETs disclosed herein having a recess depth of about 0.45 microns had a threshold voltage of approximately 3.3 V, and the proposed MOSFETs disclosed herein having a recess depth of about 0.5 microns had a threshold voltage of approximately 3.5 V, wherein the threshold voltage is defined at a voltage output of 10 V, with a 1 mA drain current.

FIG. 9 shows how the drain blocking voltage has been affected by adjusting the recess depth of the P+ wells of a MOSFET. As seen in FIG. 9, a typical MOSFET has a drain blocking voltage around 1600 V. In general, a higher threshold voltage is desirable in order to get a smaller leakage current, especially at high temperatures. For example, at 175 degrees Celsius, threshold voltage can be reduced to 1 V or less, which results in higher leakage current. By increasing the depth of the P+ well, the threshold voltage is increased and the drain blocking voltage is less. FIG. 9 shows that as the recess depth of the P+ wells is increased, the drain blocking voltage is reduced, to the point that a MOSFET having a recess depth of 0.6 microns has a drain blocking voltage around 1200 V.

By incorporating the deep recessed P+ junction into the transistor device, reliability of the transistor device is also improved. Often, traditional devices, particularly silicon carbide MOSFETs, suffer from high electrical field on the gate oxide and possible hot carrier injection during long-term blocking condition, in which the drain is placed under a high positive bias. The deeper recessed P+ wells reduce the electrical field at the gate oxide by shielding the gate oxide. In general, it has been noted that the deeper the recessed P+ junction, the lower the electrical field underneath the gate oxide, which improves the reliability of the device.

Another advantage of the transistor device having the deeper recessed P+ junction, as discussed above, is that it provides a uniform avalanche path thoroughly within the active area of the transistor device. This means that the termination area conventionally occupied by guard rings or JTEs can be eliminated, allowing for a smaller chip size to be possible.

Figure 10:
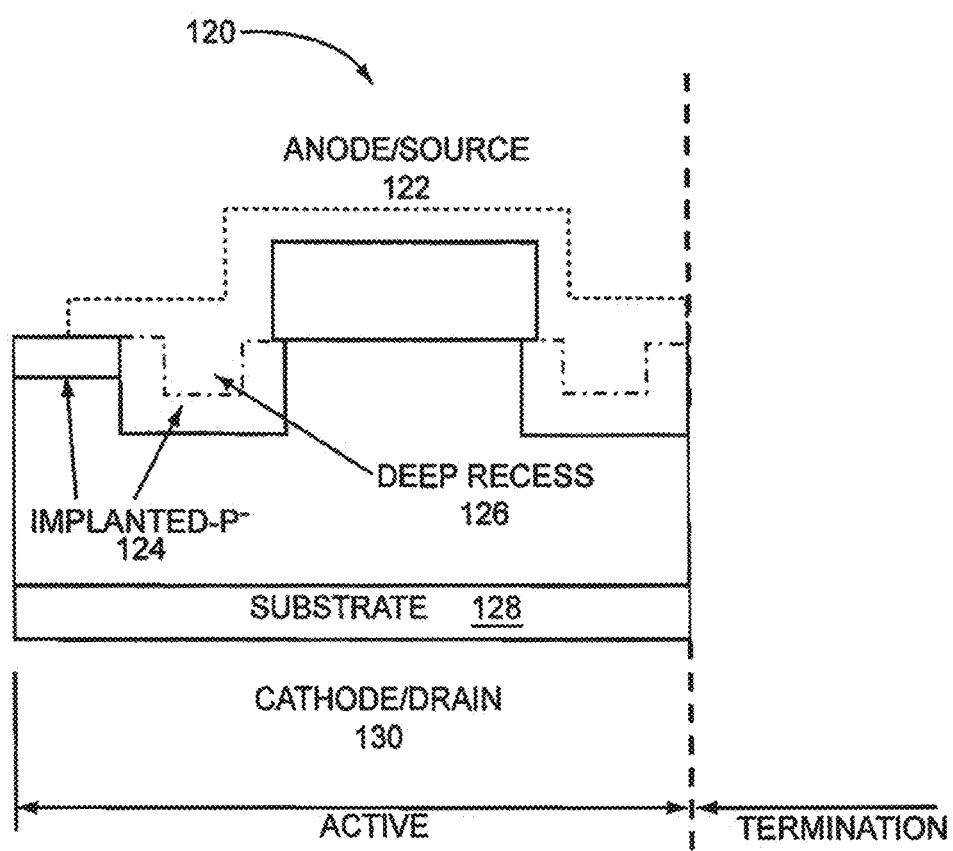
FIG. 10 illustrates an alternative new chip layout for a transistor device having no termination area according to one embodiment.

One example of a device having a smaller chip area is shown in FIG. 10. FIG. 10 illustrates an alternative new chip layout for a transistor device 120 having no termination area. The device 120 has an active area, but the termination area is eliminated. The chip layout of the device 120 is suitable for all power devices requiring small chip sizes. In the embodiment of FIG. 10, the device 120 has an anode/source 122 and implanted P-regions 124. A deep recessed P+ junction 126 is formed by any of the methods disclosed above. In one embodiment, the deep recessed P+ junction 126 is formed within a source contact area, i.e., the deep recessed P+ junction 126 is in contact with the anode/source 122. In one embodiment, the device 120 is a MOSFET device and even more preferably a Silicon Carbide (SiC) MOSFET device. However, the device 120 may more generally be any type of device having a transistor (e.g., a power MOSFET; a double differentiated field effect transistor (DMOSFET); a trench gated metal-oxide-semiconductor field effect transistor (UMOSFET); an insulated gate bipolar transistor (IGBT); and the like). The device 120 can be formed on a typical substrate 128 and have a typical cathode/drain 130.

The proposed structure of FIGS. 5A, 5B, 6, 7 and 10 may be fabricated according to any of various standard techniques. Likewise, the deep recessed P+ junction in one embodiment of the present disclosure may be formed according to any of various standard techniques.

Examples of methods that may be used to form the structures disclosed herein include, but are not limited to, the following: A method of forming a transistor device comprising providing a source and a gate on an upper surface of the transistor device, providing at least one source region, and providing at least one well region, wherein the at least one well region is recessed from the upper surface of the transistor device by a depth. In addition, a body of the transistor device may comprise silicon carbide. The providing at least one well region of the method may comprise implanting a P+ implanted junction. In another embodiment, the method may comprise providing the at least one well region in a source contact area of the transistor device. In one embodiment, the method does not include forming a termination area. In yet another embodiment, the transistor device further comprises a termination area that includes at least one termination structure, and providing the at least one doped well region further comprises implanting a P+ junction at a depth deeper than the termination structure. The disclosed method may provide a depth, the depth sufficient to result in an avalanche path to occur wholly within an active area of the transistor device instead of a termination device. In one embodiment, the method provides a transistor device, wherein the transistor device further comprises a gate oxide on the gate and wherein the depth is sufficient to reduce an electrical field on the gate oxide. In one embodiment, the depth is about approximately 0.7 microns to about approximately 1.5 microns. In another embodiment, the depth is between about approximately 0.7 to about approximately 0.9 microns. In yet another embodiment, the depth is between about approximately 0.9 to about approximately 1.1 microns. In another embodiment, the method results in a depth of about approximately 1.1 to about approximately 1.3 microns.

Though the process, exemplary materials, doping types, doping levels, structure dimensions, and the selected alternatives are outlined, these aspects are merely illustrative, and the concepts disclosed herein and the claims that follow are not limited to these aspects.

Those skilled in the art will recognize improvements and modifications to the preferred embodiments of the present disclosure. All such improvements and modifications are considered within the scope of the concepts disclosed herein and the claims that follow.

The invention claimed is:

1. A method of forming a transistor device, comprising:
   providing a substrate having a first conductivity type;
   providing a drift layer on the substrate, the drift layer having the first conductivity type and a first doping concentration;
   providing a gate and a source;
   providing at least one source region of the first conductivity type; and
   providing at least one well region of a second conductivity type opposite the first conductivity type adjacent to the at least one source region, the at least one well region having a recessed portion below the at least one source region and extending from the at least one well region by a depth sufficient to reduce an electrical field on a gate oxide on the gate, the recessed portion having a doping concentration that is less than a doping concentration of the at least one well region, and the recessed portion being formed after other portions of the at least one well region are formed.

2. The method according to claim 1, wherein a body of the transistor device comprises silicon carbide.

3. The method according to claim 1, wherein providing the at least one well region comprises implanting a P-type dopant.

4. The method according to claim 1, wherein the transistor device further comprises the gate oxide on the gate.

5. The method of claim 1 wherein the transistor device comprises a sidewall and an upper surface and the method further comprises etching at least a portion of the upper surface of the transistor device and a portion of the source to a recess depth as measured from the upper surface.

6. The method of claim 5, further comprising etching at least a portion of the sidewall of the transistor device to the recess depth as measured from the upper surface.

7. The method according to claim 5, further comprising etching away at least a portion of the at least one source region.

8. The method according to claim 5, further comprising etching away at least a portion of the at least one well region.

9. The method according to claim 5, wherein the method does not include forming a termination area.

10. The method according to claim 5, wherein the depth is sufficient to result in an avalanche path to occur wholly within an active area of the transistor device instead of a termination device.

11. The method according to claim 5, wherein the recess depth is about approximately 0.2 microns to about approximately 1.0 microns.

12. The method according to claim 5, wherein the recess depth is about approximately 0.2 microns to about approximately 0.4 microns.

13. The method according to claim 5, wherein the recess depth is about approximately 0.4 microns to about approximately 0.6 microns.

14. The method according to claim 5, wherein the recess depth is about approximately 0.6 microns to about approximately 0.8 microns.

15. The method of claim 5 further comprising forming an ohmic contact in the etched portion of the upper surface.

16. The method of claim 1 further comprising providing at least one termination structure adjacent to the at least one well region where the recessed portion is recessed deeper than the termination structure.

17. A transistor device comprising:
   a substrate having a first conductivity type;
   a drift layer on the substrate, the drift layer having the first conductivity type and a first doping concentration;
   a gate and a source;

at least one source region having the first conductivity type within the transistor device; and at least one well region of a second conductivity type within the transistor device and adjacent to the at least one source region, the at least one well region having a recessed portion below the at least one source region and extending from the at least one well region by a depth sufficient to reduce an electrical field on a gate oxide on the gate, wherein the recessed portion of the at least one well region has a doping concentration that is less than a doping concentration of the at least one well region, and the at least one well region forms a trench in an upper surface of the transistor device, the trench extending to a trench depth that is less than a well region depth of the at least one well region and greater than a source region depth of the at least one source region.

18. The transistor device according to claim 17, wherein the trench is an etched portion in the upper surface of the transistor device and at least a portion of a sidewall of the transistor device includes the etched portion where the trench depth is measured from the upper surface.

19. The transistor device according to claim 17, wherein a body of the transistor device comprises silicon carbide.

20. The transistor device according to claim 17, wherein providing the at least one well region comprises a P+ implanted junction.

21. The transistor device according to claim 17, wherein the depth is sufficient to result in an avalanche path to occur wholly within an active area of the transistor device instead of a termination device.

22. The transistor device according to claim 17, wherein the transistor device further comprises the gate oxide on the gate.

23. The transistor device of claim 17 wherein the trench is an etched portion in the source, the etched portion having the trench depth as measured from the upper surface.

24. The transistor device according to claim 23, wherein the trench depth is about approximately 0.2 microns to about approximately 1.0 microns.

25. The transistor device according to claim 23, wherein the trench depth is about approximately 0.2 microns to about approximately 0.4 microns.

26. The transistor device according to claim 23, wherein the trench depth is about approximately 0.4 microns to about approximately 0.6 microns.

27. The transistor device according to claim 23, wherein the trench depth is about approximately 0.6 microns to about approximately 0.8 microns.

28. The transistor device of claim 23 further comprising a termination area adjacent to the at least one well region, the termination area including at least one termination structure adjacent to the at least one well region where the recessed portion is recessed deeper than the at least one termination structure.

29. The transistor device of claim 17 further comprising a termination area adjacent to the at least one well region, the termination area including at least one termination structure adjacent to the at least one well region where the recessed portion is recessed deeper than the at least one termination structure.

* * * * *